(12) United States Patent
Jeong

(10) Patent No.: US 6,928,014 B2
(45) Date of Patent: Aug. 9, 2005

(54) SEMICONDUCTOR MEMORY DEVICE REDUCING NOISE

(75) Inventor: Bong-Hwa Jeong, Ichon-shi (KR)

(73) Assignee: Hynix Semicoductor Inc. (KR)

( * ) Notice: Subject to any disclaimer, the term of this patent is extended or adjusted under 35 U.S.C. 154(b) by 102 days.

(21) Appl. No.: 10/622,684

(22) Filed: Jul. 18, 2003

(65) Prior Publication Data

US 2004/0100842 A1 May 27, 2004

(30) Foreign Application Priority Data

Oct. 31, 2002 (KR) ................................. 10-2002-0066937

(51) Int. Cl.$^7$ ................................................ G11C 7/00
(52) U.S. Cl. ......................... 365/205; 365/194; 365/206
(58) Field of Search ................................. 365/205, 194, 365/206, 148, 203

(56) References Cited

U.S. PATENT DOCUMENTS

| | | | |
|---|---|---|---|
| 5,644,773 A | 7/1997 | DiMarco | |
| 6,088,291 A | 7/2000 | Fujioka et al. | |
| 6,195,302 B1 * | 2/2001 | Hardee | ........................ 365/205 |
| 6,246,620 B1 | 6/2001 | Fujioka et al. | |
| 6,459,964 B1 | 10/2002 | Vu et al. | |
| 2001/0021140 A1 | 9/2001 | Fujioka et al. | |

FOREIGN PATENT DOCUMENTS

JP          09-219091          8/1997

* cited by examiner

Primary Examiner—David Lam
(74) Attorney, Agent, or Firm—Blakely Sokoloff Taylor & Zafman

(57) ABSTRACT

The present invention provides a semiconductor memory device capable of being stably operated by reducing power noise generated while a sense amplifier performing for sensing and amplifying data supplied to a bit line. For this object, an inventive semiconductor memory device includes a cell array having a plurality of cells; a plurality of bit lines supplied with voltage stored in the plurality of the cells; a plurality of sense amplifier block for sensing and amplifying a voltage of the plurality of the bit lines, each bit line being connected to each cell; a plurality of switches for selectively connecting or disconnecting the plurality of the sense amplifier block to the plurality of the bit lines; and a sense amplifier control block for turning on the plurality of the switches by using at least two different timing sets.

13 Claims, 10 Drawing Sheets

SEMICONDUCTOR MEMORY DEVICE REDUCING NOISE

FIELD OF THE INVENTION

The present invention relates to a semiconductor memory device; and, more particularly, to a semiconductor memory device for reducing noise of a sense-amplifier that amplifies a amplified signal supplied to a bit line and outputs the amplified signal thereafter.

DESCRIPTION OF RELATED ART

FIG. 1 is a block diagram showing a conventional semiconductor memory device.

As shown, a typical semiconductor memory device includes a row address decoder 20 decoding an inputted row address and output a decoded input row address; a column address decoder 30 decoding an inputted column address to output a decoded input column address; a cell area 100 outputting data selected by outputs of the row address decoder 20 and the column address decoder 30 by possessing a plurality of a cell array 110, 120, 130 and 140 consisting of a plurality of a cell; and a output driver 40 outputting the data from the cell area 100 to an exterior part.

Meanwhile, the cell area 100 has a sense amplifier division 150 and 160 for amplifying data outputted from the cell arrays 110, 120, 130 and 140 and outputting it to the output driver 40.

FIG. 2 is a block diagram of the cell area shown in FIG. 1.

As shown, the cell area 100 includes a plurality of cell arrays 110, 130 and 180, each having a plurality of cells. Herein, each cell has a typical constitution of one capacitor and one transistor. The cell array also has a pair of bit lines BL and /BL supplied with data stored in a selected cell among the cell array, and the first and second sense amplifier divisions 150 and 170 sensing and amplifying the data supplied to the bit line pair BL and /BL. A first and a second sense amplifier control logics 200 and 300 output a first control signal BISH and a second control signal BISL for connecting or disconnecting the first and the second sense amplifier divisions 150 and 170 to cell arrays 110, 130 and 180.

FIG. 3 is a circuit diagram of the first sense amplifier division shown in FIG. 2.

As shown, the first sense amplifier division 150 includes a sense amplifier 152, a pre-charge division 155, a first equalizer 154, a second equalizer 156, and a sense-amplifier output driver 157.

The sense amplifier 152 amplifies a gap between bit lines BL and /BL as being enabled by enable signals RTO and /S. The pre-charge division 155 charges the bit line pair BL and /BL by using a bit line pre-charge voltage Vblp being enabled by a pre-charge enable signal BLEQ outputted when the sense amplifier 152 is disabled. The first equalizer 154 makes voltage levels of the two bit lines BL and /BL equivalent. Herein, the bit line pair is connected to the cell array 0 110 by a first equalization signal BLEQH. The second equalizer 156 makes also voltage levels of the two bit lines BL and /BL equivalent. Herein, the two bit line pair BL and /BL is connected to the cell array 1 130 by a second equalization signal BLEQL. The sense-amplifier output driver 157 outputs it to a data line pair DB and /DB that data are amplified by the sense amplifier 152 and a column control signal CD created by a column address.

In addition, the sense first amplifier control logic 200 outputs a first and a second control signals BISH and BISL for connecting or disconnecting the sense amplifier division 150 to the cell array 0 and the cell array 1 110 and 130. Herein, each capacitor C1 to C4 represents a load capacitance of the bit line pair BL and /BL including a unit cell and a metal wire of each cell array 0 and 1 110 and 130.

FIG. 4 is an operation waveform of the sense amplifier division shown in FIG. 3. Hereinafter, referring to FIGS. 1 to 4, the operation of the sense amplifier division in the conventional semiconductor memory device is described.

First, a former type of the sense amplifier division senses and amplifies data of a unit cell of the cell arrays each having a sense-amplifier when the data are supplied to a bit line. However, the two cell arrays 110 and 130 currently have one sense amplifier division 150 for achieving a high integration of the semiconductor memory device, and the sense amplifier division 150 is connected or disconnected to the cell arrays 110 and 130 by the proper control signals BISH and BISL.

For instance, the sense amplifier division 150 is connected to the cell array 0 110 by a first connection part 151 turned on by the first control signal BISH outputted from the first sense amplifier control logic 200, and also connected to the cell array 1 130 by a second connection part 153 turned on by the second control signal BISL.

If one of the cell arrays 110, 130 and 180 is connected to the sense amplifier division 150, one of the unit cell is selected by inputted address and the data signal of the selected unit cell is supplied to the pre-charged bit lines BL and /BL typically, it is pre-charged with a half of supply voltage.

FIG. 4 shows a case that after a high voltage level is supplied to a word line with the first and the second control signals BISH and BISL outputted from the sense amplifier control logic 200, the sense amplifier 152 subsequently senses and amplifies data supplied to the bit lines BL and /BL to supply voltage VDD and ground VSS.

In an actual semiconductor memory device, a sense amplifier division 150 has a plurality of the sense amplifiers 152 for amplifying data supplied to a plurality of the bit line pair BL and /BL connected to one of the cell arrays. The number of the sense amplifier in the bit line are decided by the number of the bit line pair BL and /BL connected to one of the cell arrays.

FIG. 5 is a block diagram of a sense amplifier division, for sensing and amplifying data supplied to eight bit line pairs connected to the cell arrays through the use of eight sense amplifiers.

As shown, a sense amplifier division 150 includes eight sense amplifiers 152a to 152h for sensing and amplifying data supplied to eight bit line pairs B10, /BL0 and B17, /BL7 connected to a cell array 0 110 and a cell array 1 130, a first connection part 151 having 16 switching transistors for connecting the eight sense amplifiers 152a to 152h to the eight bit line pairs B10, /BL0 and B17, /BL7 included in the cell array 0 110, a second connection part 153 having 16 switching transistors for connecting the eight sense amplifiers 152a to 152h to the eight bit line pairs BL0, /BL0 to BL7, /BL7 included in cell array 1 130.

However, as the integration level of the semiconductor memory device is increased, the number of the cells included in one cell array is also increased. Because of this fact, the number of the bit line pairs connected to the cell array and the number of the sense amplifiers included in the sense amplifier division are increased.

Because the number of the sense amplifier is increased, the number of the switching transistors turned on by the first and second control signals BISH and BISL outputted from the sense amplifier control division is increased, further resulting in an increase of a peak current, particular a hit peak current.

For example, if the number of the sense amplifiers included in the sense amplifier division 150 are increased to 16, the number of the switching transistors are increased to 32, and 32 switching transistors are turned on at the same time when the sense amplifier division 150 is connected to the cell array by the first and second control signals BISH and BISL, so that the peak current is largely increased. As a result of this large increase in the peak current, there is a problem that reliability on stable operation of the semiconductor memory device is decreased by an increase of power noise.

Enabling the word line WL is a very important operation in the semiconductor memory device. If the power noise is occurred by the first and second control signals BISH and BISL made before the operation of the word line, it is a critical problem that the operation reliability of the semiconductor memory device is decreased and the total operation speed of the memory becomes slow.

SUMMARY OF THE INVENTION

It is, therefore, an object of the present invention to provide a semiconductor memory device that supports more stable operation by effectively reducing noise, when a sense amplifier is operated for sensing and amplifying data supplied to a bit line.

In accordance with an aspect of the present invention, there is provided a semiconductor memory device including a cell array having a plurality of cells; a plurality of bit lines supplied with voltage stored in the plurality of the cells; a plurality of sense amplifier block for sensing and amplifying a voltage of the plurality of the bit lines, each bit line being connected to each cell; a plurality of switches for selectively connecting or disconnecting the plurality of the sense amplifier block to the plurality of the bit lines; and a sense amplifier control block for turning on the plurality of the switches by using at least two different timing sets.

In accordance with another aspect of the present invention, there is provided a semiconductor memory device including a cell array having a plurality of cells; a plurality of sense amplifier means for sensing and amplifying a voltage of a plurality of bit lines, each bit line is connected to each cell; a plurality of switches for connecting or disconnecting the plurality of the sense amplifier means to the plurality of the bit lines; a sense amplifier control means for outputting a control signal for turning on the plurality of the switches; a wire for transmitting the control signal to the sense amplifier control means; and a delay means for delaying the control signal for a predetermined time, the delay means being inserted into wire.

In accordance with the other aspect of the present invention, there is provided a semiconductor memory device including a cell array having a plurality of cells; a plurality of bit lines supplied with voltage stored in the plurality of the cells; a plurality of sense amplifier block for sensing and amplifying a voltage of the plurality of the bit lines; a plurality of switches for connecting or disconnecting the plurality of the sense amplifier block to a plurality of the bit lines; a first sense amplifier control block for turning on one part of the plurality of the switches in a first timing set; and a second sense amplifier control block for turning on the other part of the plurality of the switches in a second timing set, the other part not being turned on in the first timing set.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device according to the present invention will be described in detail referring to the accompanying drawings.

Figure 1:
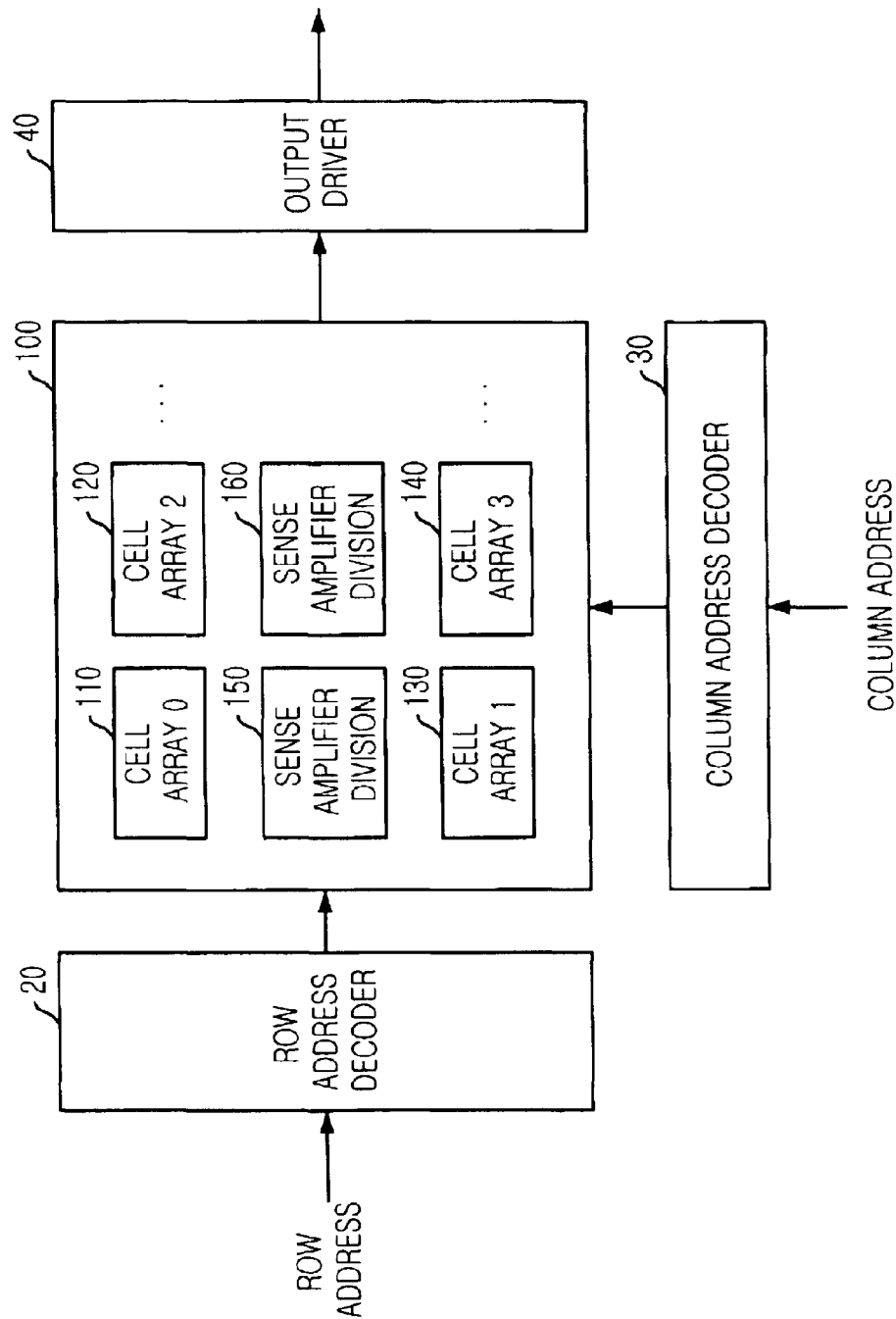
FIG. 1 is a block diagram of a conventional semiconductor memory device.
Figure 2:
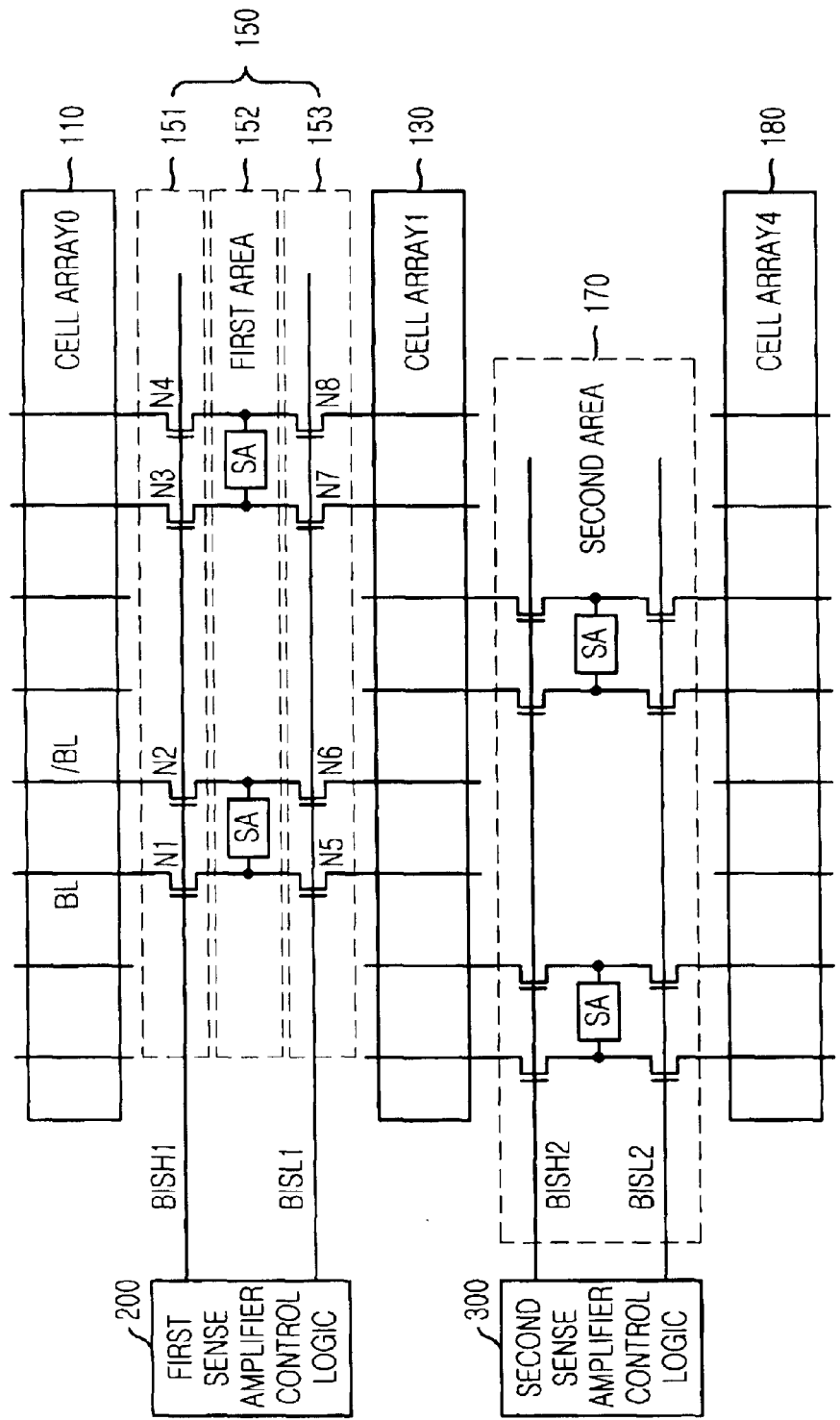
FIG. 2 is a block diagram of a cell area shown in FIG. 1.
Figure 3:
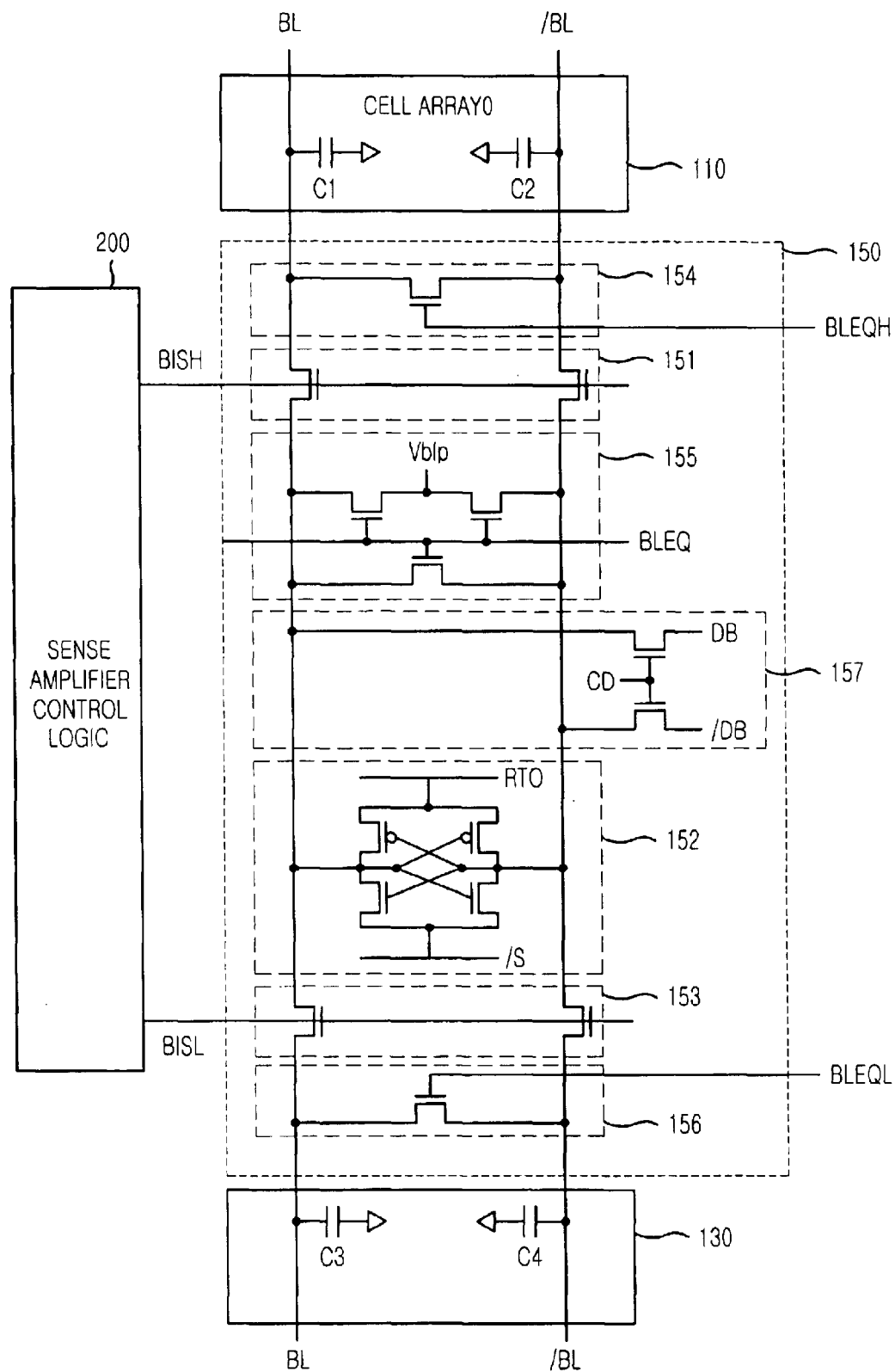
FIG. 3 is a circuit diagram of a sense amplifier division shown in FIG. 2.
Figure 4:
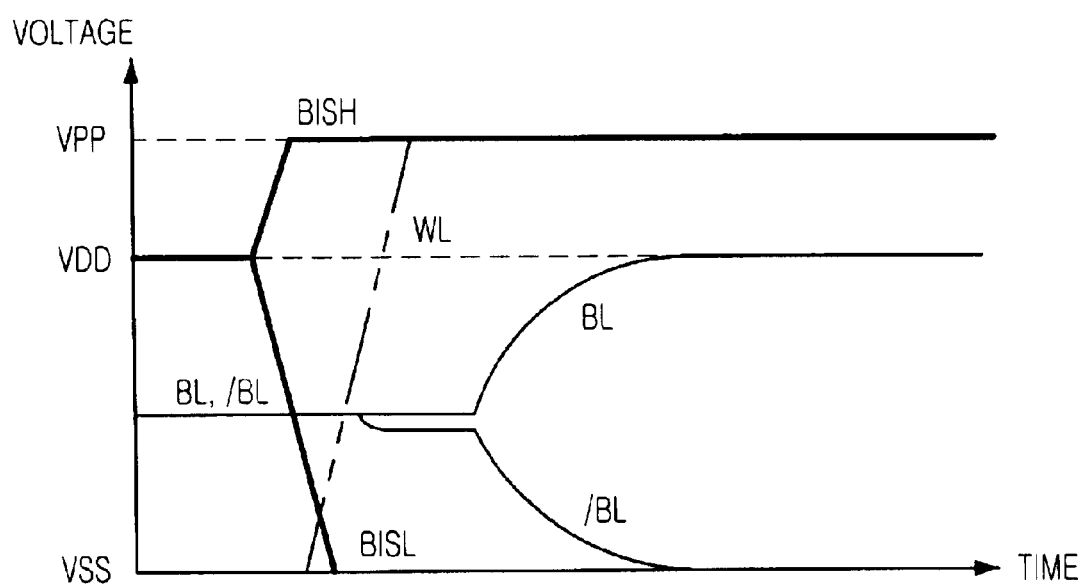
FIG. 4 shows an operation waveform of the sense amplifier division shown in FIG. 3.
Figure 5:
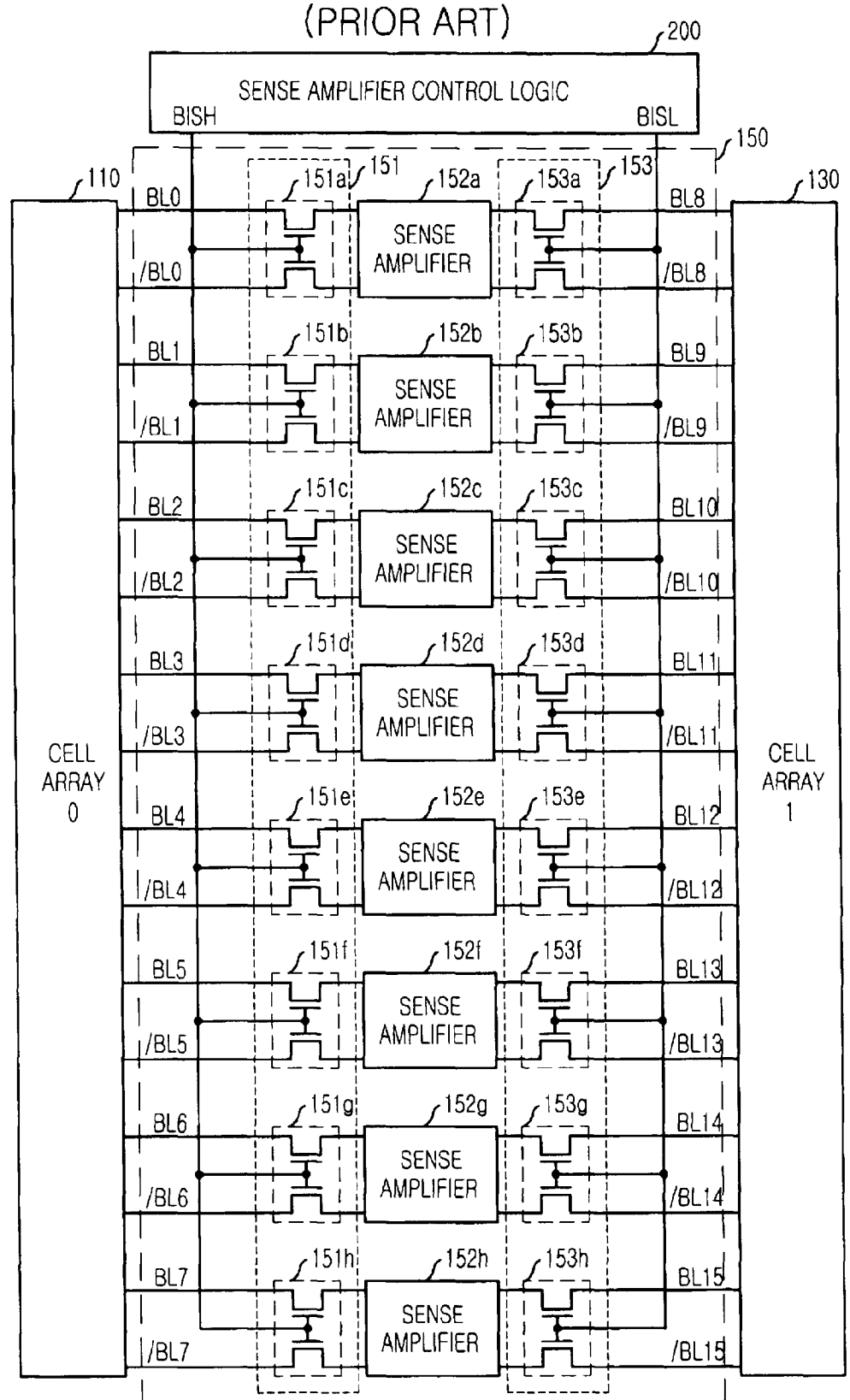
FIG. 5 is a block diagram of a conventional sense amplifier division having a plurality of sense amplifiers in accordance with the prior art.
Figure 6:
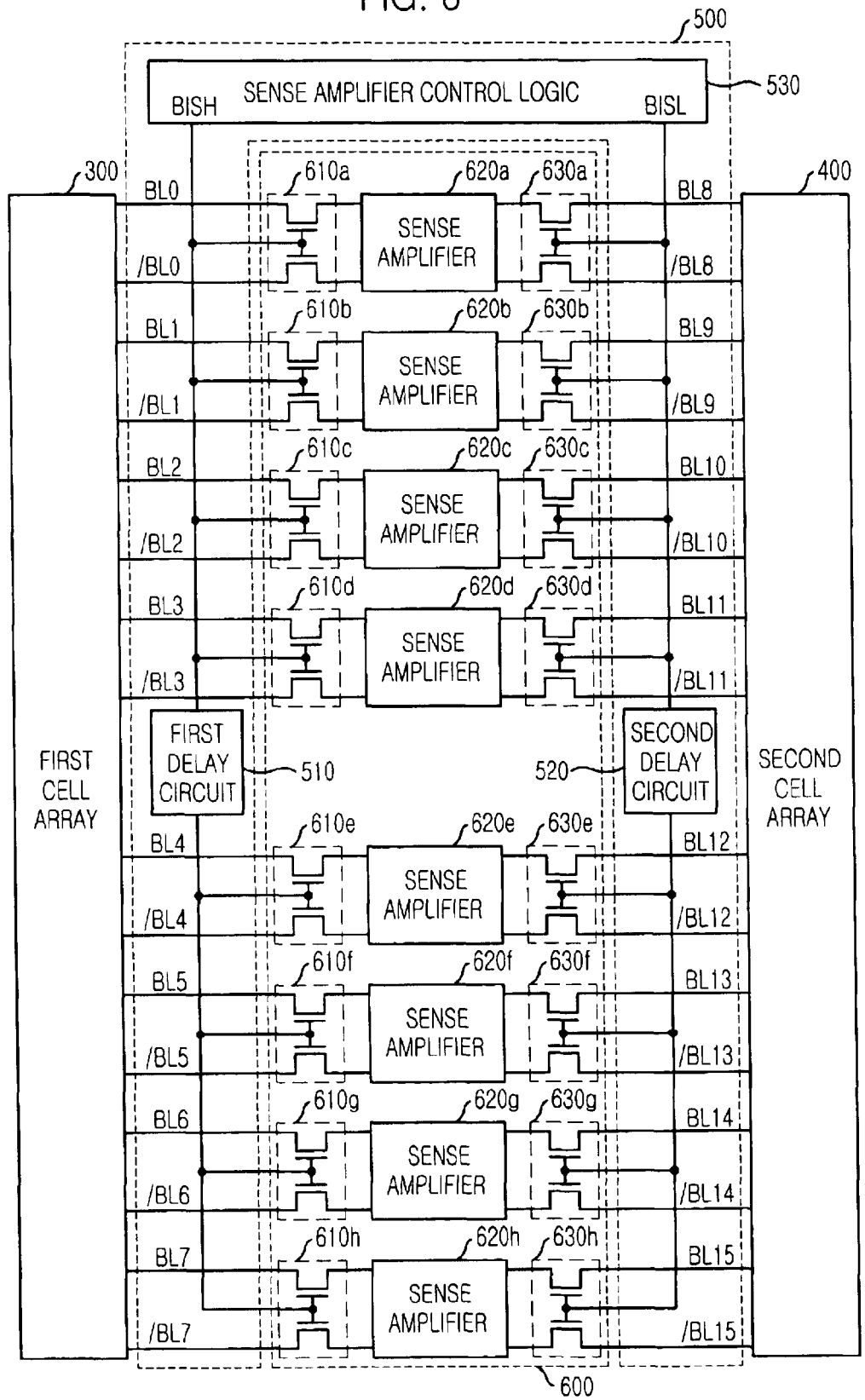
FIG. 6 is a block diagram of a semiconductor memory device in accordance with a first preferred embodiment of the present invention.

FIG. 6 is a block diagram of a semiconductor memory device in accordance with a first preferred embodiment of the present invention.

Referring to FIG. 6, the semiconductor memory device includes a first cell array 300 having a plurality of cells; a plurality of sense amplifiers 620a to 620h for sensing and amplifying a voltage of a plurality of bit line pairs BL0, /BL0~BL7, /BL7, each bit line being connected to each of the cells; a plurality of switches 610a to 610h for connecting or disconnecting the plurality of the sense amplifiers 620a to 62h to the plurality of the bit line pairs B0, /BL0 to BL7, /BL7; and a sense amplifier division 600 for turning on the plurality of the switches 620a to 620h at least two timing sets.

A sense amplifier control division 500 includes a sense amplifier control logic 530, and a first delay circuit 510. The sense amplifier control logic 530 outputs a first control signal BISH for turning on the plurality of the switches 610a to 610h. The first delay circuit 510 outputs a second control signal BISH' for turning on some switches 610e to 610h of the plurality of the switches 610a to 610h at a certain delayed time by delaying the first control signal BISH after receiving it. Herein, the first delay circuit 510 can be constructed with a resistance or a serially connected inverter.

The eight switches 610a to 610h are constructed with MOS transistors, receive the first control signal BISH at their gates, and individually connect each eight bit lines BL0,/BL0 to BL7,/BL7 to each eight sense amplifiers 620a to 620h.

For increasing integration of the semiconductor memory device, the sense amplifier division 600 is electively connected to two neighboring cell arrays 300 and 400. The eight switches 610a to 610h connect the sense amplifier division to the plurality of the bit lines BL0,/BL0 to BL7,/BL7 connected to the first cell array 300, and other eight switches 630a to 630h connect the sense amplifier division 600 to a plurality of bit lines BL8,/BL8~BL15,/BL15 connected to the second cell array 400.

In addition, a third control signal BISL is outputted from the sense amplifier control division 530, and a forth control signal BISL' is outputted from a second delay circuit 520 for turning on some 630e to 630h of the switches 630a to 630h at a certain delayed time by delaying the third control signal BISL with a predetermined time.

In the present invention, the sense amplifier division 600 includes eight sense amplifiers but it can include 16, 32, or other variable numbers of the sense amplifiers being correspondent to the number of bit line pairs. Hereinafter, it will be assumed that the sense amplifier division 600 includes eight sense amplifiers in the following preferred embodiments.

Hereinafter, referring to FIG. 6, the operation of the semiconductor memory device is described in accordance of the first preferred embodiment.

First, the sense amplifier division 600 is connected to the first cell array 300 because of the first control signal BISH outputted from the sense amplifier control logic 530. The first control signal BISH turns on four switches 610a to 610d, and connects each four sense amplifiers 620a to 620d to each four bit line pairs BL0,/BL0~BL3,/BL3.

Next, the first delay circuit 510 outputs the second control signal BISH' delayed for the predetermined time. The second control signal BISH' turns on four switches 610e to 610h, and connects each four sense amplifiers 620e to 620h to each four bit line pairs BL4,/BL4 to BL7,/BL7.

After then, an inputted address selects one cell of the first cell array 300, and data stored in the selected cell is supplied to one bit line pair, for example BL0 and /BL0, among the plurality of bit line pairs BL0,/BL0~BL7,/BL7. Next, the sense amplifier is enabled, thereby sensing the signal supplied to the bit line pair and amplifying the sensed signal to supply voltage VDD or ground VSS. The data amplified by the sense amplifier and subsequently supplied to the bit line pair are delivered to an output driver throughout a data bus. The output driver then outputs the data to an exterior circuit.

Thus, the semiconductor memory device in accordance with the present invention does not turns on the eight switches 610a to 610h at the same time when the eight sense amplifiers included in the sense amplifier division 600 are connected to the first cell array 300 by eight switches 610a to 610h. However, the semiconductor memory device firstly turns on four switches 610a to 610d for connecting four sense amplifiers 620a to 620d to the first cell array 300 and then other four switches 610e to 610h for connecting four sense amplifiers 620e to 620h to the first cell array 300.

The above-described operation reduces a peak hit current greatly compared to the case of turning on eight switches simultaneously. If the peak hit current is reduced, power noise is also reduced, further in stable operation of the memory device.

Moreover, as the number of the sense amplifiers included in the sense amplifier division is increased, the peak hit current is decreased if a plurality of the sense amplifiers are connected to the cell array by turning on the switch orderly.

In other words, because the semiconductor memory device has a sufficient operation time for outputting the first and second control signals and selecting the cell in the cell array, the operation using a splitting time technique has no effect to a total operation speed of the semiconductor memory device.

Figure 7:
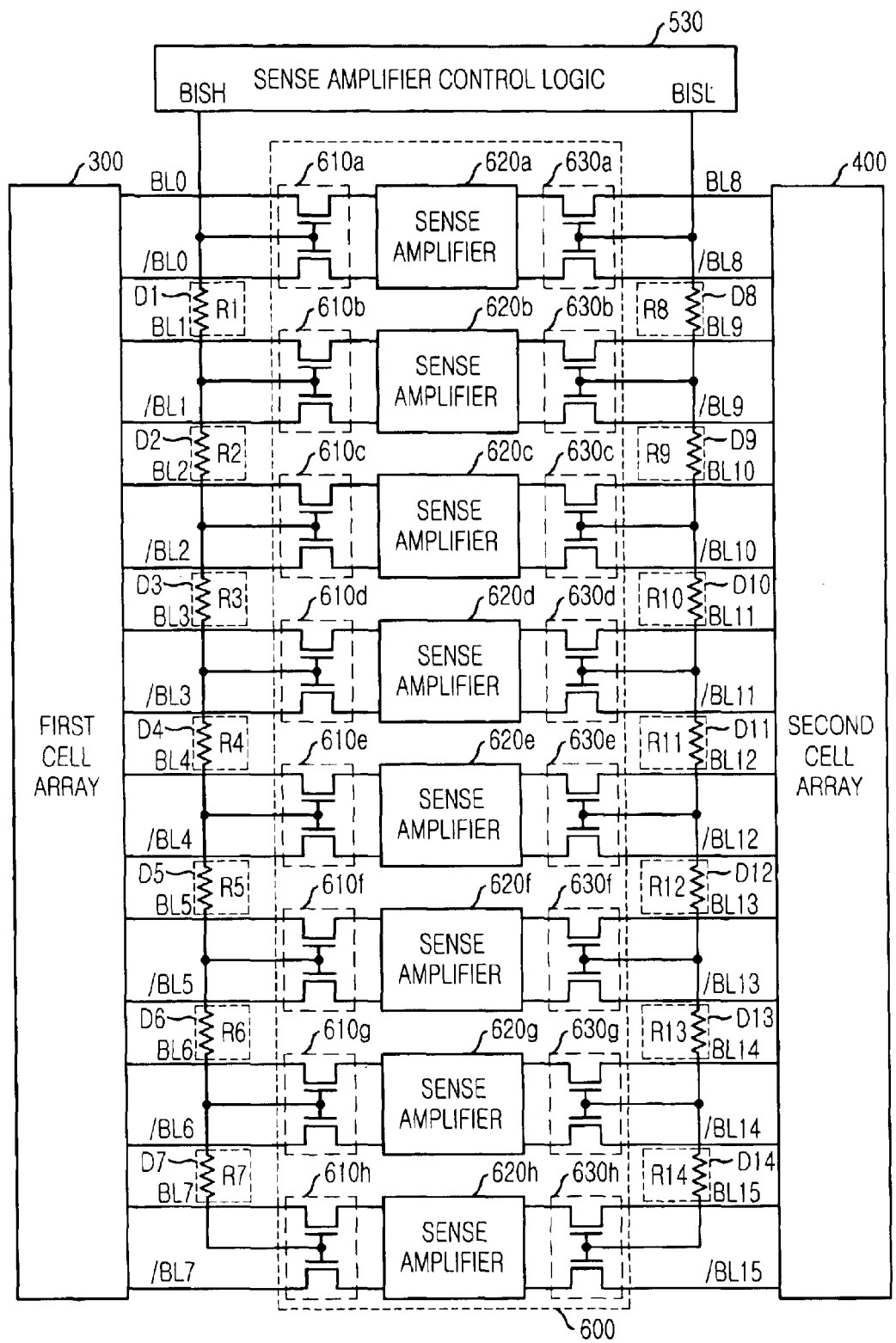
FIG. 7 is a block diagram of a semiconductor memory device in accordance with a second preferred embodiment of the present invention.

FIG. 7 is a block diagram of a semiconductor memory device in accordance with a second preferred embodiment of the present invention.

As shown, the semiconductor memory device includes a first cell array 300 having a plurality of cells, a plurality of bit line pairs BL0,/BL0 to BL7,/BL7 individually connected to each cell of the first cell array 300, a plurality of sense amplifiers 620a to 620h for sensing and amplifying data if the data of a selected cell is supplied to a plurality of the bit line pairs, a plurality of switches 610a to 610h for connecting or disconnecting the plurality of the sense amplifiers 620a to 620h to the plurality of the bit line pairs BL0,/BL0 to BL7,/BL7, a sense amplifier control logic 530 for outputting a control signal BISH for turning on one set of switches among the plurality of the switches 610a to 610h, a wire for delivering the control signal BISH to the switches 610a to 610h, and a delay logic D1 to D7 inserted into the wire for creating a control signal delayed for a constant time period from the control signal BISH and orderly turning on the other set of the switches among the plurality of the switches 610a to 610h that should be turned on in the above first operation.

A plurality of enable signals orderly delayed are created by serially connected resistances R1 to R7 and R8 to R14 or several serially connected inverters.

The operation of the semiconductor memory device in accordance with the second preferred embodiment of the present invention will be described in detail.

Overall operation of the semiconductor memory device is similar to that explained in FIG. 6. However, a first switch 610a is turned on by the control signal BISH outputted from the sense amplifier control logic 530 for connecting the first cell array 300 to a sense amplifier division 600, and then, a second switch 610b is turned at a certain time delayed by the first delay D1. All switches are orderly turned on in this way.

The operation that orderly turns on the switches reduces a peak hit current more than that of turning on the eight switches 610a to 610h simultaneously. If the peak hit current flowing to the eight switches 610a to 610h is reduced, power noise also is reduced.

Figure 8:
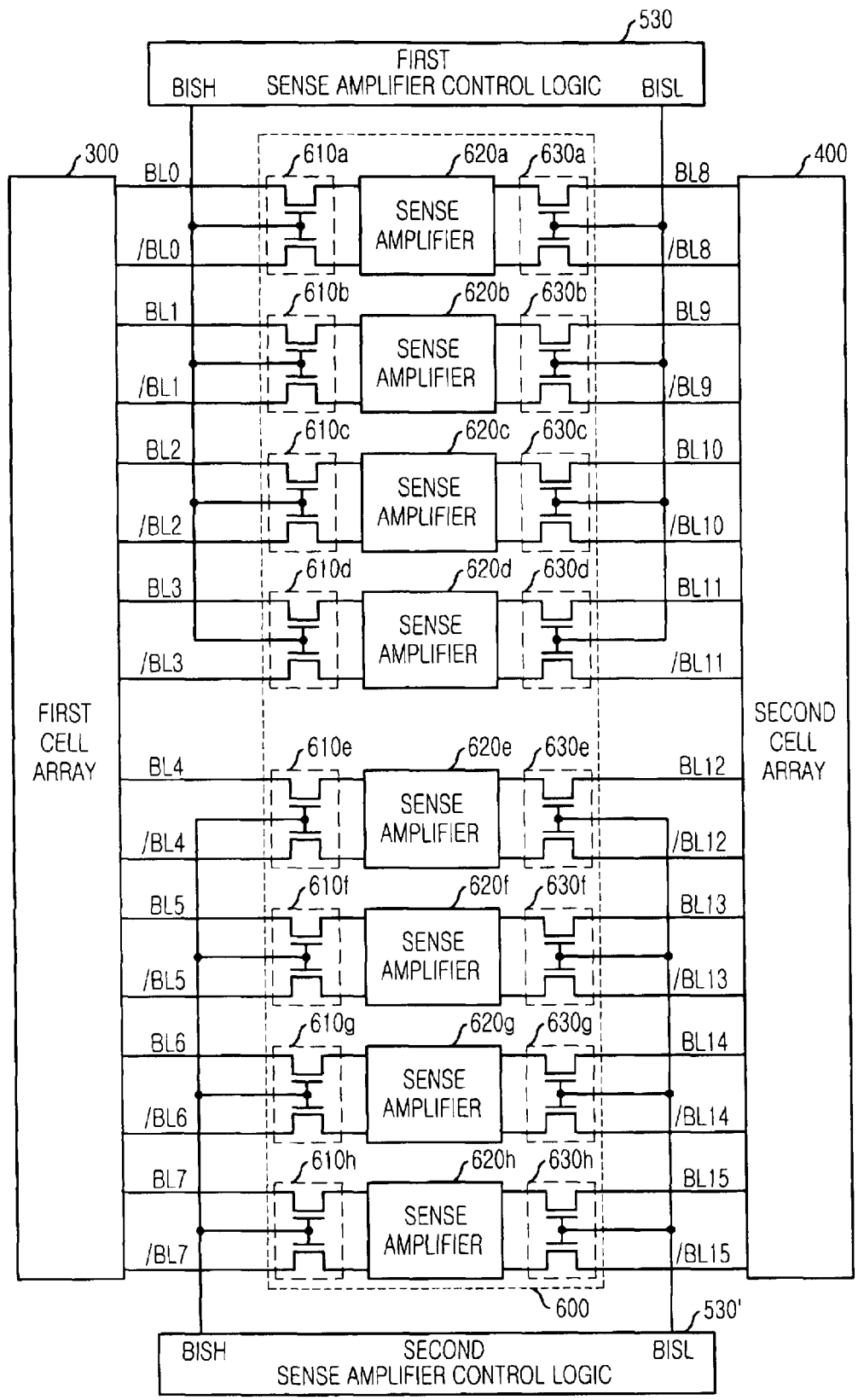
FIG. 8 is a block diagram of a semiconductor memory device in accordance with a third preferred embodiment of the present invention.

FIG. 8 is a block diagram of a semiconductor memory device in accordance with a third preferred embodiment of the present invention.

As shown, the semiconductor memory device in accordance with the third preferred embodiment includes a first cell array 300 having a plurality of cells, a plurality of bit line pairs BL0,/BL0 to BL7,/BL7 individually connected to each cell of the first cell array 300, a plurality of sense amplifiers 620a to 620h for sensing and amplifying data if the data of a selected cell is supplied to a plurality of the bit line pairs, a plurality of switches 610a to 610h for connecting or disconnecting the plurality of the sense amplifiers 620a to 620h to the plurality of the bit line pairs BL0,/BL0 to BL7,/BL7, a first sense amplifier control logic 530 for turning on some switches, e.g., 610a to 610d of the plurality of the switches 610a to 610h in a first timing set, and a second sense amplifier control logic 530' for turning on the other switches in a second timing set, e.g., 610e to 610h that are not turned on in the first timing set.

The operation of the semiconductor memory device in accordance with the third preferred embodiment of the present invention will be described in detail.

Overall operation of the semiconductor memory device is similar to that shown in FIG. 6. However, four switches 610a to 610d are turned on by a first control signal BISH outputted from the first sense amplifier control logic 530, and other four switches 610e to 610h are turned on by a second control signal BISH' outputted from the second sense amplifier control logic 530'.

The above operation, which turns on the switches at two different timing sets by the first and the second control signals BISH and BISH', reduces a peak hit current compared to that generated when turning on the eight switches 610a to 610h at the same time. Moreover, operation current can be reduced because only necessary sense amplifier among the plurality of the sense amplifiers 620a to 620h included in the sense amplifier division 600 is selected and connected to any of the cell arrays 300 and 400.

Figure 9:
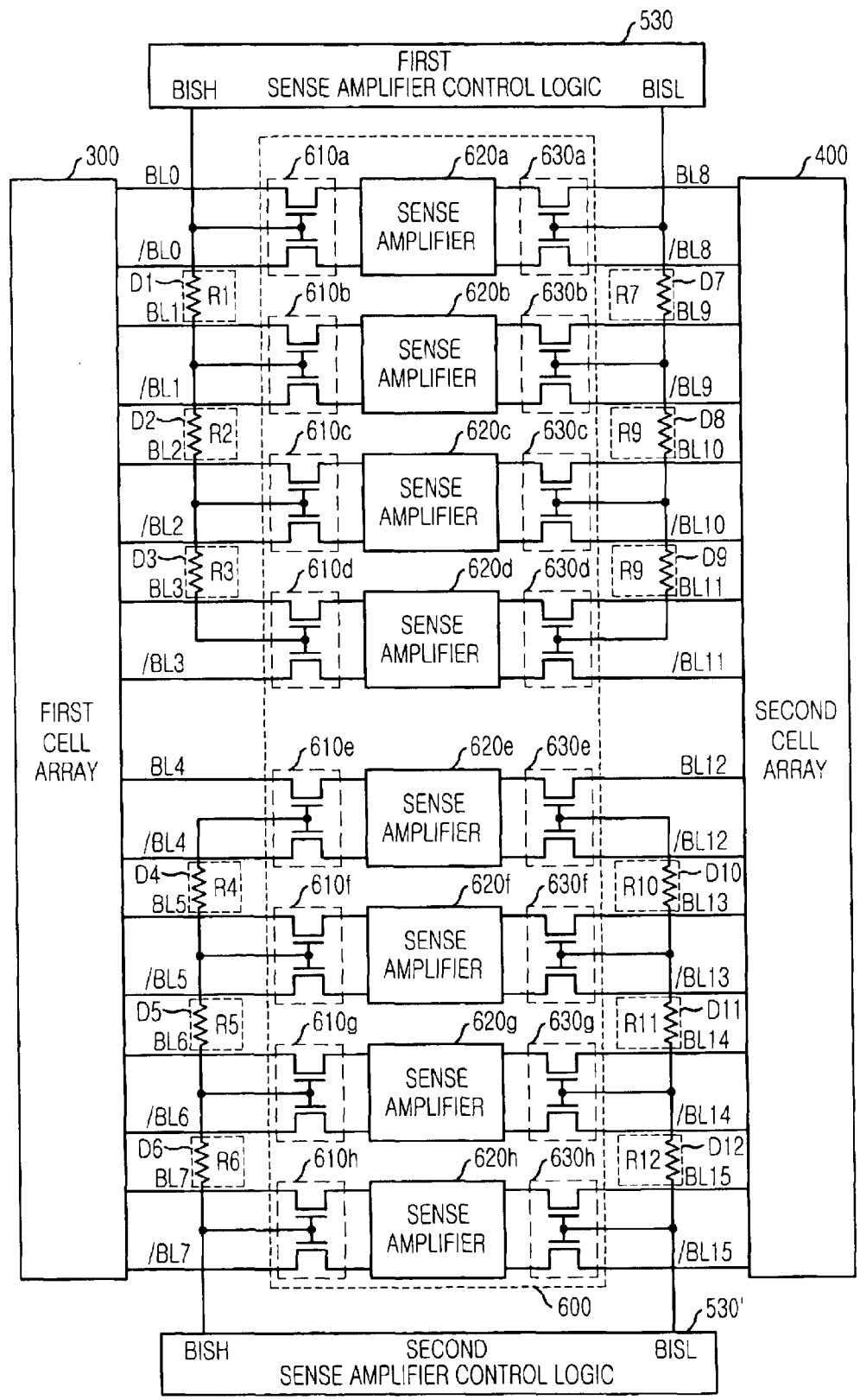
FIG. 9 is a block diagram of a semiconductor memory device in accordance with a forth preferred embodiment of the present invention.

FIG. 9 is a block diagram of a semiconductor memory device in accordance with a forth preferred embodiment of the present invention.

As shown, in addition to the constitution elements described in FIG. 8, the semiconductor memory device in accordance with a forth preferred embodiment further includes a plurality of first delay functions D1 to D3, e.g., R1 to R3, and D7 to D9, e.g., R7 to R9, and a plurality of second delay functions D4 to D6, e.g., R4 to R6, and D10 to D12, e.g., R10 to R12. The plurality of the first delay functions D1 to D3 are serially connected for turning on a plurality of switches 610a to 610d orderly at a first timing set by orderly delaying an output signal of the first sense amplifier control logic 530. The plurality of second delay functions D4 to D6 are serially connected for turning on a plurality of switches 610e to 610h orderly at a second timing set by orderly delaying a output signal of the second sense amplifier control logic 530'.

Using the first and second sense amplifier control logic 530', four switches are individually turned on at each different timing set. The sense amplifiers 620a to 620h of the sense amplifier division 600 are connected to the cell arrays 300 and 400 at the first or the second timing set. Thus, if switches are orderly turned on at each different timing set, it is possible to reduce power noise generated when turning on switches effectively.

Figure 10:
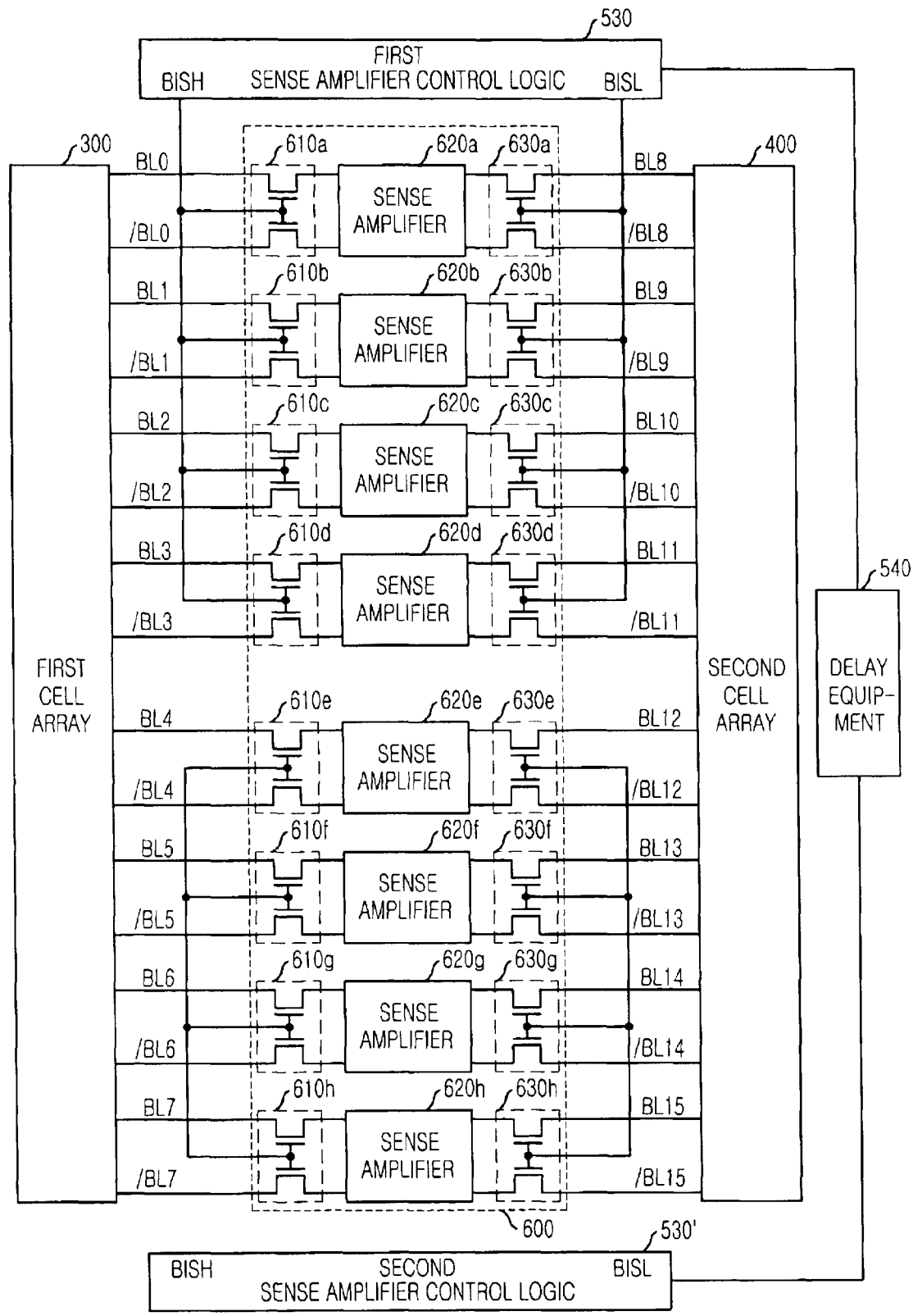
FIG. 10 is a block diagram of a semiconductor memory device in accordance with a fifth preferred embodiment of the present invention.

FIG. 10 is a block diagram of a semiconductor memory device in accordance with a fifth preferred embodiment of the present invention.

As shown, a second sense amplifier control logic 530' included in the semiconductor memory device is controlled by a signal delayed by a delay equipment 540 which delays a signal outputted from a first sense amplifier control logic 530.

Controlling the first and second sense amplifier control logics 530 and 530' by employing such method described above, a control method can be simplified because it is unnecessary to make a control signal for controlling the second sense amplifier control logic 530' in the semiconductor memory device. However, the above method has disadvantage that a necessary sense amplifier among a plurality of sense amplifiers 620e to 620h included in a sense amplifier division 600 cannot be electively connected to the cell arrays 300 and 400.

The semiconductor memory device in accordance with the present invention can reduce a peak hit current occurring when the sense amplifier is connected to the cell array. If the peak hit current is reduced, power noise also is reduced. If the power noise in its operation is reduced while operating the memory device, the semiconductor memory device operates stably.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a cell array having a plurality of cells;
   a plurality of bit lines supplied with voltage stored in the plurality of the cells;
   a plurality of sense amplifier means for sensing and amplifying a voltage of the plurality of the bit lines, each bit line being connected to each cell;
   a plurality of switches for selectively connecting or disconnecting the plurality of the sense amplifier means to the plurality of the bit lines; and
   a sense amplifier control means for turning on the plurality of the switches by using at least two different timing sets.

2. The semiconductor memory device as recited in claim 1, wherein the switch includes a MOS transistor.

3. A semiconductor memory device, comprising:
   a cell array having a plurality of cells;
   a plurality of sense amplifier means for sensing and amplifying a voltage of a plurality of bit lines, each bit line being connected to each cell;
   a plurality of switches for connecting or disconnecting the plurality of the sense amplifier means to the plurality of the bit lines;
   a sense amplifier control means for outputting a control signal for turning on the plurality of the switches;
   a wire for transmitting the control signal to the sense amplifier control means; and
   a delay means for delaying the control signal for a predetermined time, the delay means being inserted into wire.

4. The semiconductor memory device as recited in claim 3, wherein the delay means outputs one signal delayed for a predetermined time from the control signal.

5. The semiconductor memory device as recited in claim 4, wherein the delay means includes a resistance.

6. The semiconductor memory device as recited in claim 4, wherein the delay means includes a serially connected inverter.

7. The semiconductor memory device as recited in claim 4, wherein the delay means generates a plurality of enable signals orderly delayed for a predetermined time interval from the control signal, and the plurality of the enable signals orderly turn on the plurality of the sense amplifier means.

8. The semiconductor memory device as recited in claim 7, wherein the plurality of the enable signals orderly delayed are generated by using a serially connected resistance.

9. The semiconductor memory device as recited in claim 7, wherein a plurality of the enable signals orderly delayed are generated by using several serially connected inverters.

10. A semiconductor memory device, comprising:
    a cell array having a plurality of cells;
    a plurality of bit lines supplied with voltage stored in the plurality of the cells;
    a plurality of sense amplifier means for sensing and amplifying a voltage of the plurality of the bit lines;

a plurality of switches for connecting or disconnecting the plurality of the sense amplifier means to a plurality of the bit lines;

a first sense amplifier control means for turning on one part of the plurality of the switches in a first timing set; and a second sense amplifier control means for turning on the other part of the plurality of the switches in a second timing set, the other part not being turned on in the first timing set.

11. The semiconductor memory device as recited in claim 10, further comprising:

a plurality of a first delay means serially connected for orderly turning on the one part of the plurality of the switches mandated to be turned on in the first timing set; and a plurality of a second delay means serially connected for orderly turning on the other part of the plurality of the switches mandated to be turned on in the second timing set.

12. The semiconductor memory device as recited in claim 11, wherein the second sense amplifier control means is controlled by a signal delayed through the use of a control signal that controls the first sense amplifier control means.

13. The semiconductor memory device as recited in claim 10, wherein the switch includes a MOS transistor.

* * * * *